United States Patent
Kim et al.

(10) Patent No.: US 9,705,574 B2
(45) Date of Patent: Jul. 11, 2017

(54) METHOD AND APPARATUS FOR TRANSMITTING DATA SIGNAL BY USING MASSIVE MIMO IN A WIRELESS ACCESS SYSTEM

(71) Applicant: LG ELECTRONICS INC., Seoul (KR)

(72) Inventors: Sanggook Kim, San Diego, CA (US); Wookbong Lee, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 15/113,989

(22) PCT Filed: Mar. 3, 2015

(86) PCT No.: PCT/KR2015/002026
§ 371 (c)(1),
(2) Date: Jul. 25, 2016

(87) PCT Pub. No.: WO2015/133784
PCT Pub. Date: Sep. 11, 2015

(65) Prior Publication Data
US 2016/0344455 A1 Nov. 24, 2016

Related U.S. Application Data

(60) Provisional application No. 61/948,549, filed on Mar. 6, 2014.

(51) Int. Cl.
*H04B 7/04* (2017.01)
*H04W 72/04* (2009.01)
(Continued)

(52) U.S. Cl.
CPC ............ *H04B 7/0413* (2013.01); *H04B 1/02* (2013.01); *H04B 7/0678* (2013.01);
(Continued)

(58) Field of Classification Search
CPC ... H04W 72/04; H04B 7/0413; H04B 7/0689; H04B 1/02; H04B 7/061; H04L 5/0007; H04L 5/0035; H03M 13/11; H04J 11/0053
See application file for complete search history.

(56) References Cited

U.S. PATENT DOCUMENTS

2010/0290411 A1 11/2010 Kim et al.
2012/0113928 A1* 5/2012 Hwang .................. H03M 13/27
370/329
(Continued)

FOREIGN PATENT DOCUMENTS

WO WO 2008/094121 A1 8/2008
WO WO 2011/043554 A2 4/2011

*Primary Examiner* — Ross Varndell
(74) *Attorney, Agent, or Firm* — Birch, Stewart, Kolasch & Birch, LLP

(57) ABSTRACT

The present invention relates to a wireless access system, and more particularly, to a method and apparatus for transmitting data signal by using a massive Multi Input Multi Output (MIMO). In one aspect of the present invention, a method for transmitting data signals by using a massive Multi Input Multi Output (MIMO), the method is performed by a transmitter and comprises steps of inputting input bits of data signals to a channel encoder; outputting from the channel encoder a first coded bit set including one or more coded bits and second coded bit sets including one or more coded bits; transmitting first data signals of the first coded bit set by applying a first MIMO mode; and transmitting second data signals of the second coded bit sets by applying a second MIMO mode.

8 Claims, 11 Drawing Sheets

(a)

(b)

(51) Int. Cl.
  *H04B 1/02* (2006.01)
  *H04B 7/06* (2006.01)
  *H04B 7/0413* (2017.01)
  *H04L 5/00* (2006.01)
  *H04J 11/00* (2006.01)
  *H03M 13/11* (2006.01)

(52) U.S. Cl.
  CPC .......... *H04B 7/0689* (2013.01); *H04W 72/04* (2013.01); *H03M 13/11* (2013.01); *H04B 7/061* (2013.01); *H04B 7/063* (2013.01); *H04B 7/0617* (2013.01); *H04J 11/0053* (2013.01); *H04L 5/0035* (2013.01); *H04L 5/0048* (2013.01); *H04L 5/0053* (2013.01); *H04L 5/0057* (2013.01)

(56) References Cited

U.S. PATENT DOCUMENTS

| | | | |
|---|---|---|---|
| 2012/0275531 A1 | 11/2012 | Wu et al. | |
| 2015/0146644 A1* | 5/2015 | Kim | H04L 5/0048 370/329 |
| 2016/0183135 A1* | 6/2016 | Kang | H04W 76/025 455/444 |
| 2016/0269885 A1* | 9/2016 | Kim | H04W 8/005 |
| 2016/0269887 A1* | 9/2016 | Kim | H04W 72/02 |
| 2016/0294519 A1* | 10/2016 | Kim | H04L 5/00 |

\* cited by examiner

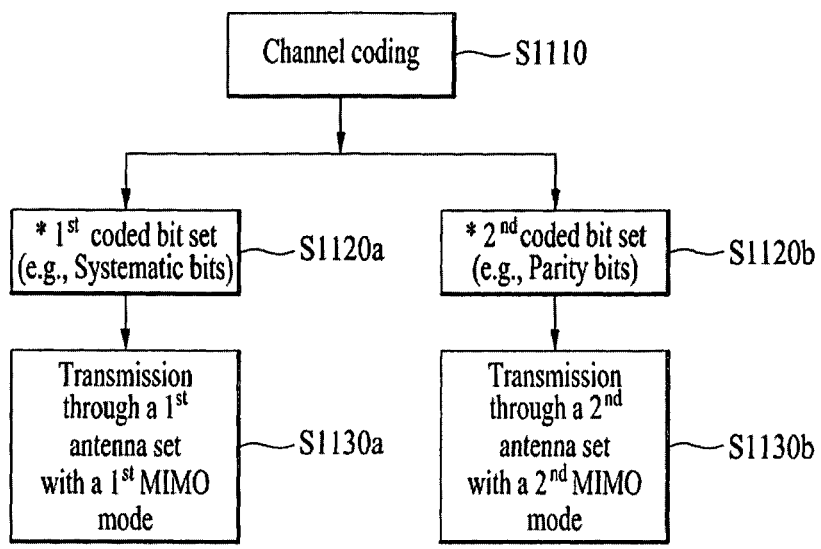
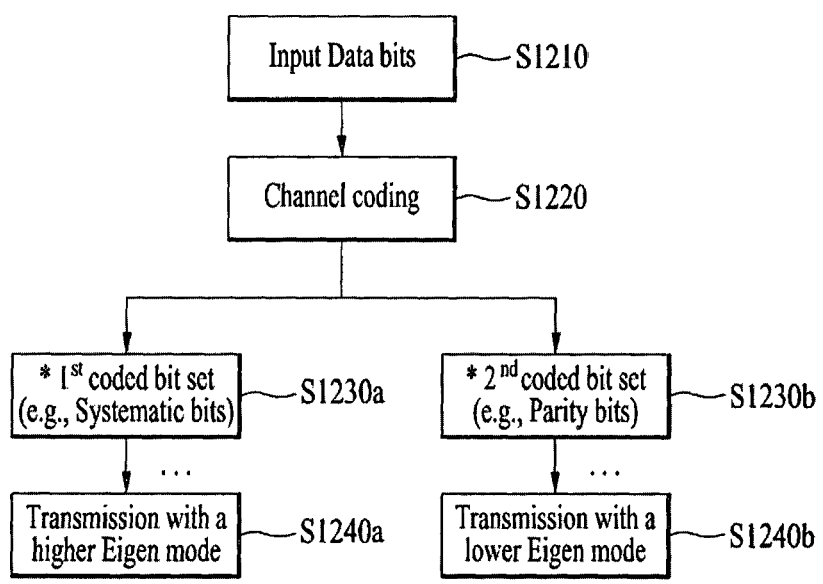

METHOD AND APPARATUS FOR TRANSMITTING DATA SIGNAL BY USING MASSIVE MIMO IN A WIRELESS ACCESS SYSTEM

CROSS REFERENCE TO RELATED APPLICATIONS

This application is the National Phase of PCT International Application No. PCT/KR2015/002026, filed on Mar. 3, 2015, which claims priority under 35 U.S.C. 119(e) to U.S. Provisional Application No. 61/948,549, filed on Mar. 6, 2014, all of which are hereby expressly incorporated by reference into the present application.

TECHNICAL FIELD

The present invention relates to a wireless access system, and more particularly, to a method and apparatus for transmitting data signal by using a massive Multi Input Multi Output (MIMO).

BACKGROUND ART

A wireless communication system has been widely developed to provide various kinds of communication services such as voice and data. Generally, the wireless communication system is a multiple access system that can support communication with multiple users by sharing available system resources (bandwidth, transmission power, etc.). Examples of the multiple access system include a code division multiple access (CDMA) system, a frequency division multiple access (FDMA) system, a time division multiple access (TDMA) system, an orthogonal frequency division multiple access (OFDMA) system, and a single carrier frequency division multiple access (SC-FDMA) system.

In recent years, due to explosive growth of mobile traffic, evolutionary remedy to coup it will provide a temporary relief to operators. Accordingly, research and industry communities have started to define the next generation systems, broadly known as "5G" communication system. Initially spell-out requirements for 5G are (1) 1000 times higher mobile data volume per area, (2) 10 times to 100 times higher number of connected devices, (3) 10 times to 100 times higher typical user data rate, (4) 10 times longer battery life for low power MMC (Multi-Media Card), and (5) 5 times reduced End-to-End latency.

Some technologies that have been evolved and matured will take key roles again to meet the requirements for 5G. MIMO has drawn a lot of interest because it exploits a new dimension such that spectral efficiency and reliability are enhanced.

Conventional MIMO technique supports two types of operation, such as (1) Closed loop type and (2) Open loop type. In closed mode of operation, the MIMO channel information between a transmitter and a receiver is used to select the weights of pre-coder such that beam-forming gain is achieved. This means if the channel information (e.g., feedback information for the channel or downlink/uplink channel measurement) is not accurate, e.g., due to relative movement of the transmitter and the receiver, the gain from closed-loop operation will be diminished.

In the MIMO system, a number of antenna elements are forced to be limited mainly due to physical dimension it occupies. Limitation in terms of the number of antenna elements are being lifted due to huge benefits we can get if massive MIMO is allowed. For example, extra antennas help by focusing energy into ever smaller regions of space to bring huge improvements in throughput and radiated energy efficiency. In addition, other benefits of massive MIMO include an extensive use of inexpensive low-power components, a reduced latency, a simplification of the medium-access control (MAC) layer, and robustness against intentional jamming.

However, despite of the benefits of the massive MIMO, there still remains to be studied about the allocation of antennas of the massive MIMO and channel coding methods for the massive MIMO.

DETAILED DESCRIPTION OF THE INVENTION

Technical Problems

Accordingly, the present invention is directed to methods and apparatuses for channel coding for efficient use of the massive MIMO.

The object of the present invention is to propose ways to jointly exploit benefits from massive MIMO and channel coding, especially a turbo coding.

Another object of the present invention is to provide method for applying MIMO schemes, allocating antenna sets, and assigning resource regions to systematic bits and parity bits processed by the turbo coding.

The other object of the present invention is to provide retransmission method for the systematic bits and parity bits.

Still other object of the present invention is to provide a user equipment (UE) and/or a base station apparatus for supporting the above-described methods.

Technical problems to be solved by the present invention are not limited to the above-mentioned technical problem, and other technical problems not mentioned above can be clearly understood by one skilled in the art from the following description.

Technical Solutions

The present invention relates to a wireless access system, and more particularly, to a method and apparatus for transmitting data signal by using a massive Multi Input Multi Output (MIMO).

In one aspect of the present invention, a method for transmitting data signals by using a massive Multi Input Multi Output (MIMO), the method is performed by a transmitter and comprises steps of inputting input bits of data signals to a channel encoder; outputting from the channel encoder a first coded bit set including one or more coded bits and second coded bit sets including one or more coded bits; transmitting first data signals of the first coded bit set by applying a first MIMO mode; and transmitting second data signals of the second coded bit sets by applying a second MIMO mode.

In another aspect of the present invention, a transmitter for transmitting data signals by using a massive Multi Input Multi Output (MIMO), the transmitter comprises massive antennas; a channel encoder; and a processor for supporting a transmission of the data signals. The processor may be configured to input the bits of data signals to a channel encoder. The channel encoder may be configured to output a first coded bit set including one or more coded bits and second coded bit sets including one or more coded bits. In addition, the massive antennas may be configured to transmit first data signals of the first coded bit set by applying a first MIMO mode, and transmit second data signals of the second coded bit sets by applying a second MIMO mode.

The first coded bit set may contain systematic bits of the input bits and the second coded bit sets contains parity bits for the input bits.

The first MIMO mode may be a closed loop mode and the second MIMO mode is an open loop mode.

In this case, the first data signals are transmitted on a first resource region and the second data signals are transmitted on a second resource region. In addition, the first data signals and the second data signals are transmitted through same antenna elements.

The first data signals may be transmitted through a first antenna set and the second data signals are transmitted through a second antenna set. In this case, the first data signals and the second data signals are transmitted on a same resource region.

The first MIMO mode and the second MIMO mode may be determined according to a direction of a receiver.

The above embodiments are part of preferred embodiments of the present invention. Obviously, it is to be understood to those having ordinary knowledge in the art that various embodiments having the technical features of the present invention can be implemented on the detailed description of the present invention as set forth herein.

Advantageous Effects

According to exemplary embodiments of the present invention, the following advantages can be obtained.

Beam forming gain (i.e., closed loop gain) can be maintained for systematic bits while open-loop diversity gain is provided to parity bits by using the method and apparatus of the embodiments of the present application. Hence, the performance of the system that employs a certain coding scheme with importance on systematic bits, e.g., turbo coding, can be further enhanced in conjunction with multiple antennas for transmission.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 11 illustrates still the other method for transmitting data signals of the present invention.

FIG. 12 illustrates still the other method for transmitting data signals of the present invention.

BEST MODE FOR CARRYING OUT THE INVENTION

Figure 1:
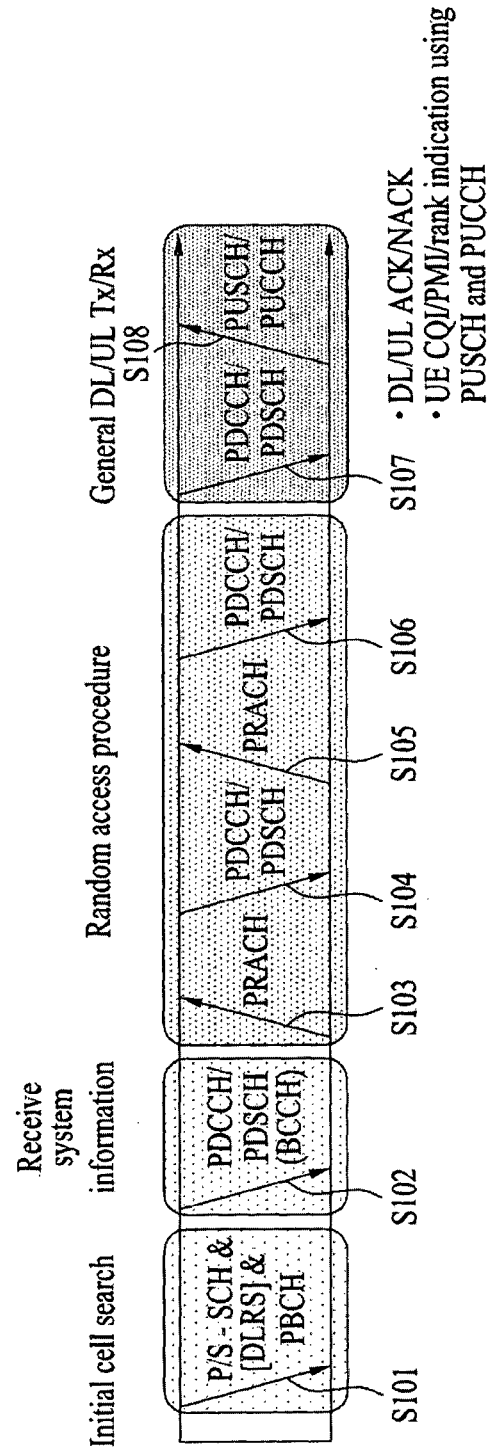
FIG. 1 is a view referred to for describing physical channels used in a 3GPP LTE system and a general signal transmission method using the physical channels.

Exemplary embodiments of the present invention provide a method and apparatus for channel coding for efficient use of the massive MIMO.

The embodiments of the present invention described below are combinations of elements and features of the present invention in specific forms. The elements or features may be considered selective unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions or elements of any one embodiment may be included in another embodiment and may be replaced with corresponding constructions or features of another embodiment.

In the description of the attached drawings, a detailed description of known procedures or steps of the present invention will be avoided lest it should obscure the subject matter of the present invention. In addition, procedures or steps that could be understood by those skilled in the art will not be described either.

In the embodiments of the present invention, a description has been mainly made of a data transmission and reception relationship between a BS and a UE. A BS refers to a terminal node of a network, which directly communicates with a UE. A specific operation described as being performed by the BS may be performed by an upper node of the BS.

Namely, it is apparent that, in a network comprised of a plurality of network nodes including a BS, various operations performed for communication with a UE may be performed by the BS, or network nodes other than the BS. The term 'BS' may be replaced with a fixed station, a Node B, an eNode B (eNB), an ABS (Advanced Base Station), an access point, etc.

The term UE may be replaced with the terms MS (Mobile Station), SS (Subscriber Station), MSS (Mobile Subscriber Station), AMS (Advanced Mobile Station), mobile terminal, STA (STAtion), etc. Especially, it should be noted that the terms 'eNB' and 'eNode-B' are used interchangeably and the terms 'UE' and 'terminal' are interchangeably used in the embodiments of the present invention.

A transmitter is a fixed and/or mobile node that provides a data or voice service and a receiver is a fixed and/or mobile node that receives a data or voice service. Therefore, an MS may serve as a transmitter and a BS may serve as a receiver, on uplink. Likewise, the MS may serve as a receiver and the BS may serve as a transmitter, on downlink.

The embodiments of the present invention are supported by standard documents disclosed for at least one of wireless access systems including IEEE 802.xx systems, a 3GPP system, a 3GPP LTE system, and a 3GPP2 system. In particular, the embodiments of the present invention are supported by 3GPP TS 36.211, 3GPP TS 36.212, 3GPP TS 36.213, 3GPP TS 36.321 and 3GPP TS 36.331 documents. The steps or parts, which are not described to clearly reveal the technical idea of the present invention, in the embodiments of the present invention may be supported by the above documents. All terms used in the embodiments of the present invention may be explained by the standard documents.

Reference will now be made in detail to the preferred embodiments of the present invention with reference to the accompanying drawings. The detailed description, which will be given below with reference to the accompanying drawings, is intended to explain exemplary embodiments of the present invention, rather than to show the only embodiments that can be implemented according to the invention. Specific terms used for the embodiments of the present invention are provided to aid in understanding of the present invention. These specific terms may be replaced with other terms within the scope and spirit of the present invention.

The embodiments of the present invention may be used in various wireless access technologies, such as CDMA (Code Division Multiple Access), FDMA (Frequency Division Multiple Access), TDMA (Time Division Multiple Access), OFDMA (Orthogonal Frequency Division Multiple access), and SC-FDMA (Single Carrier Frequency Division Multiple Access).

CDMA may be implemented with radio technology such as UTRA (Universal Terrestrial Radio Access) or CDMA2000. TDMA may be implemented with radio technology such as GSM (Global System for Mobile communications)/GPRS (General Packet Radio Service)/EDGE (Enhanced Data Rates for GSM Evolution). OFDMA may be implemented with radio technology such as IEEE 802.11 (Wi-Fi), IEEE 802.16 (WiMAX), IEEE 802.20, and E-UTRA (Evolved UTRA).

UTRA is part of a UMTS (Universal Mobile Telecommunications System). 3GPP LTE is a part of Evolved UMTS (E-UMTS), which uses E-UTRA. 3GPP LTE employs OFDMA on downlink and uses SC-FDMA on uplink. LTE-A (Advanced) is an evolved version of 3GPP LTE. The following embodiments of the present invention mainly describe examples of the technical characteristics of the present invention as applied to the 3GPP LTE/LTE-A systems. However, this is merely exemplary and the present invention can be applied to IEEE 802.16e/m systems.

1. 3GPP LTE/LTE-A System

In a wireless access system, a UE receives information from a BS through a downlink and transmits information to the BS through an uplink. Information transmitted and received between the UE and the BS includes general data information and control information. A variety of physical channels are provided according to type/use of information transmitted and received between the UE and the BS.

FIG. 1 is a view referred to for describing physical channels used in a 3GPP LTE system and a signal transmission method using the same.

When a UE is powered on or newly enters a cell, the UE performs an initial cell search operation including synchronization with a BS in S101. To implement this, the UE receives a primary synchronization channel (P-SCH) and a secondary synchronization channel (S-SCH) to synchronize with the BS and acquires information such as cell ID.

Then, the UE can acquire broadcast information in the cell by receiving a physical broadcast channel (PBCH) signal from the BS. The UE can receive a downlink reference signal (DL RS) in the initial cell search operation to check a downlink channel state.

Upon completion of the initial cell search, the UE receives a physical downlink control channel (PDCCH) and a physical downlink shared channel (PDSCH) according to PDCCH information to acquire more detailed system information in S102.

Subsequently, the UE can perform a random access procedure, S103 to S106, in order to complete access to the BS. To achieve this, the UE transmits a preamble through a physical random access channel (PRACH) (S103) and receives a response message to the preamble through a PDCCH and a PDSCH corresponding to the PDCCH (S104). In the case of contention-based random access, the UE can perform a contention resolution procedure of transmitting an additional PRACH signal (S105) and receiving a PDCCH signal and a PDSCH signal corresponding to the PDCCH signal (S106).

Upon completion of the random access procedure, the UE can perform a general uplink/downlink signal transmission procedure of receiving a PDCCH signal and/or a PDSCH signal (S107) and transmitting a physical uplink shared channel (PUSCH) and/or a physical uplink control channel (PUCCH) (S108).

Control information transmitted from a UE to a BS is referred to as uplink control information (UCI). UCI includes HARQ-ACK/NACK (Hybrid Automatic Repeat reQuest Acknowledgement/Negative-ACK), SR (Scheduling Request), CQI (Channel Quality Indication), PMI (Precoding Matrix Indicator), RI (Rank Information), etc.

In the LTE system, UCI is periodically transmitted through a PUCCH, in general. However, UCI can be transmitted through a PUSCH when control information and traffic data need to be simultaneously transmitted. In addition, UCI can be non-periodically transmitted through a PUSCH at the request/instruction of a network.

Figure 2:
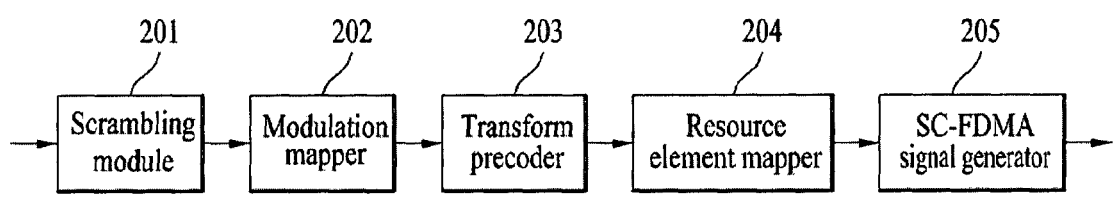
FIG. 2 illustrates a configuration of a user equipment (UE) and a signal processing procedure for transmitting an uplink signal.

FIG. 2 is a view referred to for describing a configuration of a UE and a signal processing procedure of the UE to transmit an uplink signal.

To transmit an uplink signal, a scrambling module 210 of the UE can scramble a transmitted signal using a UE-specific scramble signal. The scrambled signal is input to a modulation mapper 202 and modulated into a complex symbol using BPSK (Binary Phase Shift Keying), QPSK (Quadrature Phase Shift Keying), or 16QAM/64QAM (Quadrature Amplitude Modulation). The complex symbol is processed by a conversion precoder 203 and applied to a resource element mapper 204. The resource element mapper 204 can map the complex symbol to a time-frequency resource element. The signal processed in this manner can be transmitted to the BS through an antenna via an SC-FDMA signal generator 205.

Figure 3:
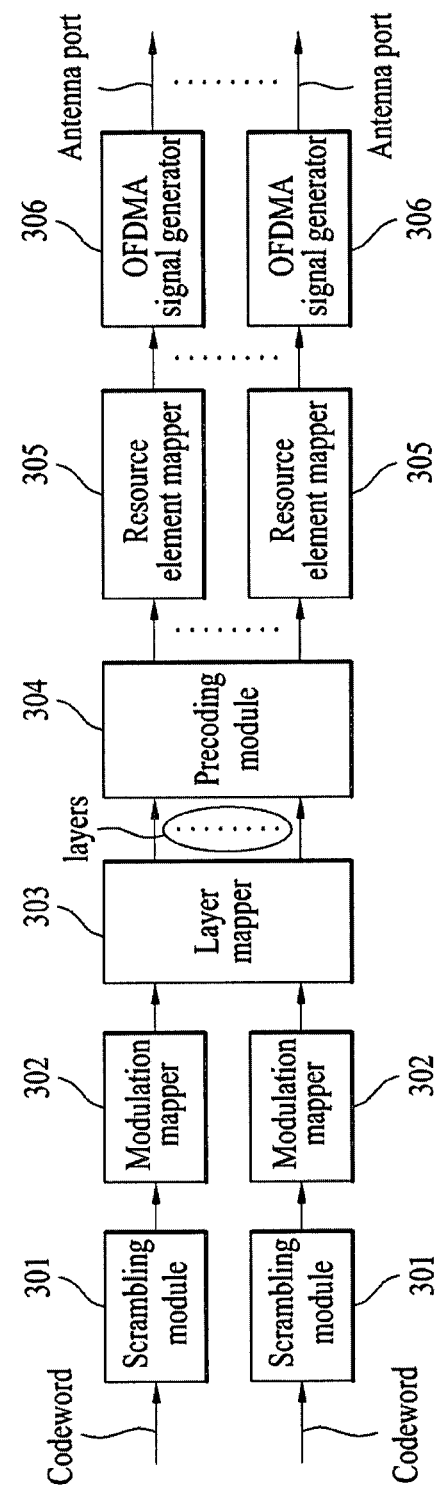
FIG. 3 illustrates a configuration of a base station (BS) and a signal processing procedure for transmitting a downlink signal.

FIG. 3 is a view referred to for describing a configuration of a BS and a signal processing procedure of the BS to transmit a downlink signal.

In a 3GPP LTE system, the BS can transmit one or more codewords through a downlink. Each codeword can be processed into a complex symbol through a scrambling module 301 and a modulation mapper 302 as in the uplink shown in FIG. 2. The complex symbol is mapped by a layer mapper 303 to a plurality of layers each of which can be multiplied by a precoding matrix by a precoding module 304 to be allocated to each transmit antenna. A transmission signal for each antenna, processed as above, is mapped by a resource element mapper 305 to a time-frequency resource element. The mapped signal is subjected to an OFDM signal generator 306 and transmitted through each antenna. That is, each of the codewords can be converted to the OFDM signal, i.e., downlink signal through the processing described in FIG. 3.

When a UE transmits a signal on uplink in a radio communication system, Peak-to-Average Ratio (PAPR) becomes a problem, compared to a case in which a BS transmits a signal on downlink. Accordingly, SC-FDMA is used for uplink signal transmission, as described above with reference to FIGS. 2 and 3, while OFDMA is used for downlink signal transmission.

Figure 4:
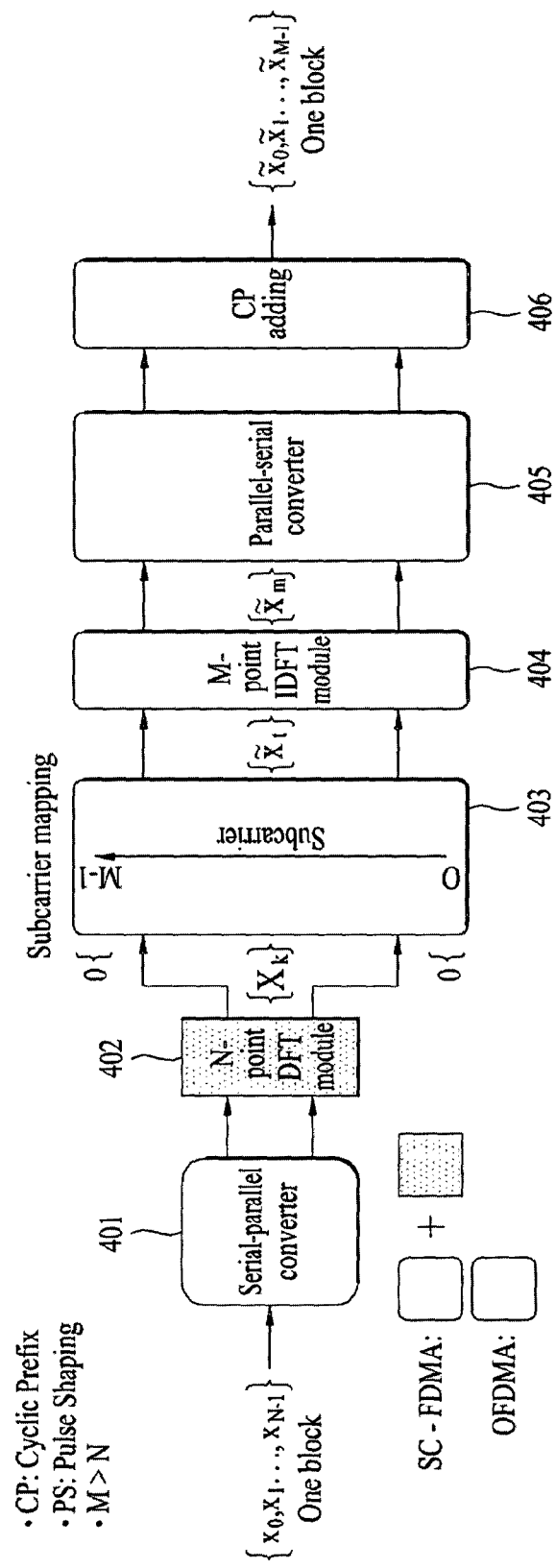
FIG. 4 is a view referred to for describing a configuration of a UE and SC-FDMA and OFDMA schemes.

FIG. 4 is a view referred to for describing a configuration of a UE and SC-FDMA and OFDMA.

A 3GPP system (e.g. LTE system) employs OFDMA on downlink and uses SC-FDMA on uplink. Referring to FIG. 4, both a UE for uplink signal transmission and a BS for downlink signal transmission include a serial-to-parallel converter 401, a subcarrier mapper 403, an M-point IDFT module 404, and a cyclic prefix (CP) addition module 406.

The UE for transmitting a signal through SC-FDMA additionally includes an N-point DFT module 402. The N-point DFT module 402 offsets the influence of IDFT of the M-point IDFT module 404 on a transmission signal such that the transmission signal has single carrier properties.

2. Massive MIMO System

Multiple-antenna (MIMO) technology is becoming mature for wireless communications and has been incorporated into wireless broadband standards like LTE system and Wi-Fi system. Basically, the more antennas of the transmitter/receiver is equipped with, the more the possible signal paths and the better the performance in terms of data rate and link reliability.

Massive MIMO (also known as Large-Scale Antenna Systems, a Very Large MIMO, a Hyper MIMO, a Full-Dimension MIMO and an ARGOS) makes a clean break with current practice through the use of a very large number of service antennas (e.g., hundreds or thousands) that are operated fully coherently and adaptively. Extra antennas help by focusing the transmission and reception of signal energy into ever-smaller regions of space. This brings huge improvements in throughput and energy efficiency, in particularly when combined with simultaneous scheduling of a large number of user terminals (e.g., tens or hundreds). Massive MIMO was originally envisioned for time division duplex (TDD) operation, but can potentially be applied also in frequency division duplex (FDD) operation.

Figure 5:
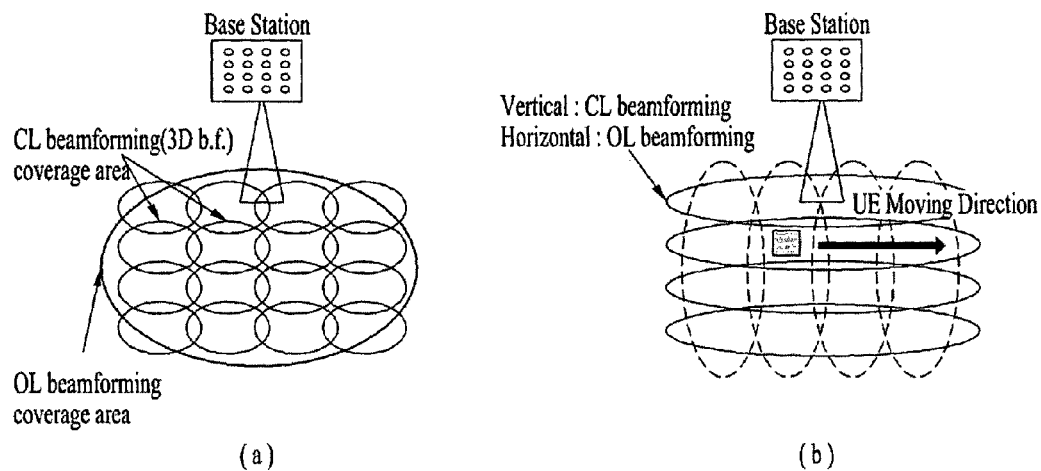
FIG. 5 illustrates a comparison of a conventional massive MIMO system and a proposed massive MIMO system.

FIG. 5 illustrates a comparison of a conventional massive MIMO system and a proposed massive MIMO system.

FIG. 5(a) shows the conventional massive MIMO system and FIG. 5(b) shows the proposed MIMO system. At the conventional massive MIMO system, it does not consider the direction of the receiver. Accordingly, the base station is able to provide the close loop and open loop beamforming without considering the direction of the receiver movement.

On the other hand, the proposed massive MIMO system is able to provide the adaptive close loop and open loop beamforming with varied locations according to the direction of the receiver. That is, the proposed massive MIMO system considers the moving direction of the receiver.

Figure 6:
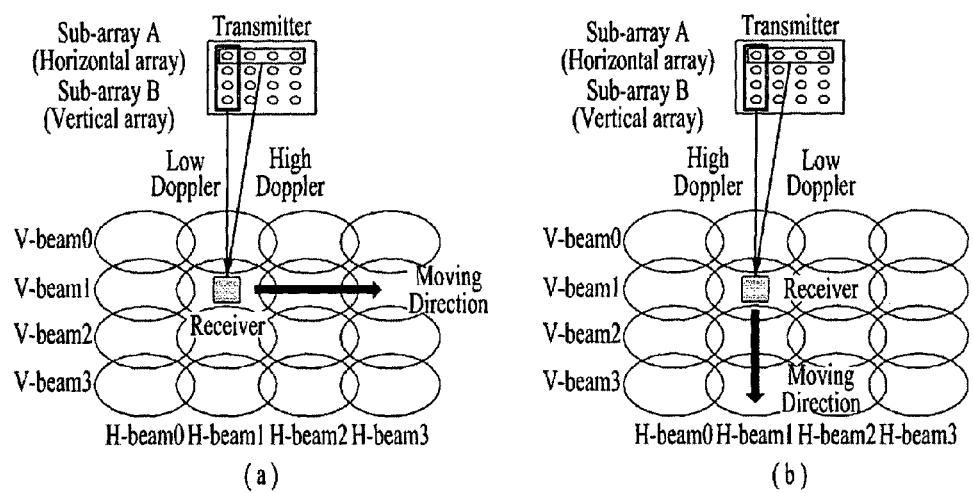
FIG. 6 illustrates examples of the proposed massive MIMO system.

FIG. 6 illustrates examples of the proposed massive MIMO system.

Benefits of massive MIMO can be achieved by considering user's movement. For example, let assume that user equipment (UE) is mainly moving along the horizon. This means less movement along the horizon, but more rapid movement in vertical direction. In this case, pre-coding benefits can be assigned to horizontal direction while providing open-loop diversity gain exploited through vertical direction.

Referring to FIG. 6 (a), a receiver moves along horizon direction. In this case, pre-coding benefits can be assigned along V-beams and open-loop gain along H-beams by properly choosing subset of antenna elements.

Referring to FIG. 6(b), a receiver moves along vertical direction. In this case, pre-coding benefits can be assigned along H-beams and open-loop gain along V-beams by properly choosing subset of antenna elements.

In FIG. 6, the H-beams mean the electromagnetic wave pattern with energy mass emitted from the sub-array A and the V-beams mean the electromagnetic wave pattern with energy mass emitted from the sub-array B of the transmitter.

3. Channel Coding 3.1 Turbo Coder

Turbo code is "de facto" channel code since its introduction in 1993 due to its performance close to Shannon limit. In Turbo decoding, the integrity of systematic bits is more important than that of parity bits. In this invention, we proposed ways to jointly exploit benefits from massive MIMO and channel coding, especially Turbo coding. In particular, beam-forming gain is maintained for systematic bits while open-loop diversity gain is provided to parity bits.

Figure 7:
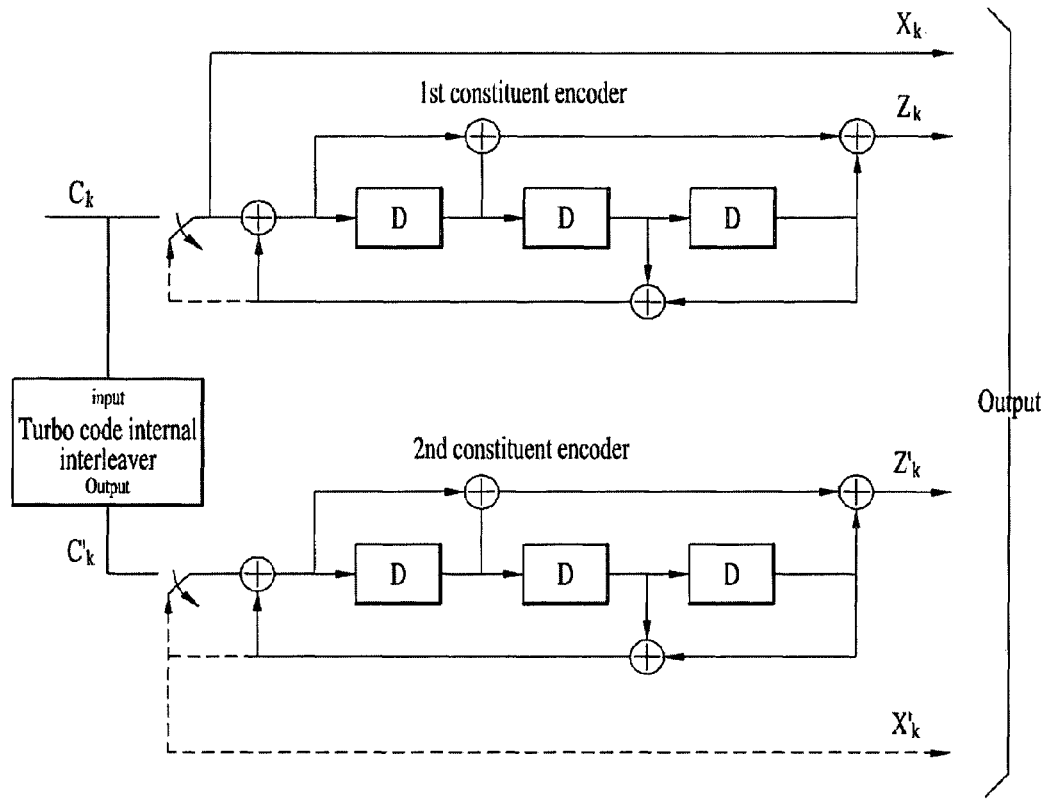
FIG. 7 illustrates an example of a structure of rate ⅓ turbo encoder.

FIG. 7 illustrates an example of a structure of rate ⅓ turbo encoder.

The scheme of turbo encoder is a Parallel Concatenated Convolutional Code (PCCC) with two 8-state constituent encoders and one turbo code internal interleaver. The coding rate of turbo encoder is ⅓.

The transfer function of the 8-state constituent code for the PCCC is $$G(D) = \left[1, \frac{g_1(D)}{g_0(D)}\right],$$

where g0(D)=1+D2+D3, and g1(D)=1+D+D3.

The initial value of the shift registers of the 8-state constituent encoders shall be all zeros when starting to encode the input bits. The output from the turbo encoder is $d_k^{(0)}=x_k$, $d_k^{(1)}=z_k$, and $d_k^{(2)}=z'_k$, for k=0, 1, 2, . . . , K−1.

If the code block to be encoded is the 0-th code block and the number of filler bits is greater than zero, i.e., F>0, then the encoder shall set $c_k$, =0, k=0, . . . , (F−1) at its input and shall set $d_k^{(0)}$=<NULL>, k=0, . . . , (F−1) and $d_k^{(1)}$=<NULL>, k=0, . . . , (F−1) at its output.

The bits input to the turbo encoder are denoted by $c_0$, $c_1$, $c_2$, $c_3$, . . . , $c_{K-1}$, and the bits output from the first and second 8-state constituent encoders are denoted by $z_0$, $z_1$, $z_2$, $z_3$, . . . , $z_{k-1}$ and $z'_0$, $z'_1$, $z'_2$, $z'_3$, . . . , $z'_{k-1}$, respectively. The bits output from the turbo code internal interleaver are denoted by $c'_0$, $c'_1$, . . . , $c'_{k-1}$, and these bits are to be the input to the second 8-state constituent encoder.

The turbo encoder includes two parallel concatenated convolutional encoders. A data stream in input to the encoder and each constituent encoder produces a parity stream. Thus, two parity bits are output by the turbo encoder for each systematic bit, yielding a code rate ⅓. In this case, $x_k$ represents systematic bits, $z_k$ and $z_k'$ represent parity bits, respectively.

The systematic bits contain the original bit values for every input bit and the parity bits are generated for an error correction procedure. Accordingly, it is needed to more reliable protection to the systematic bits.

Figure 8:
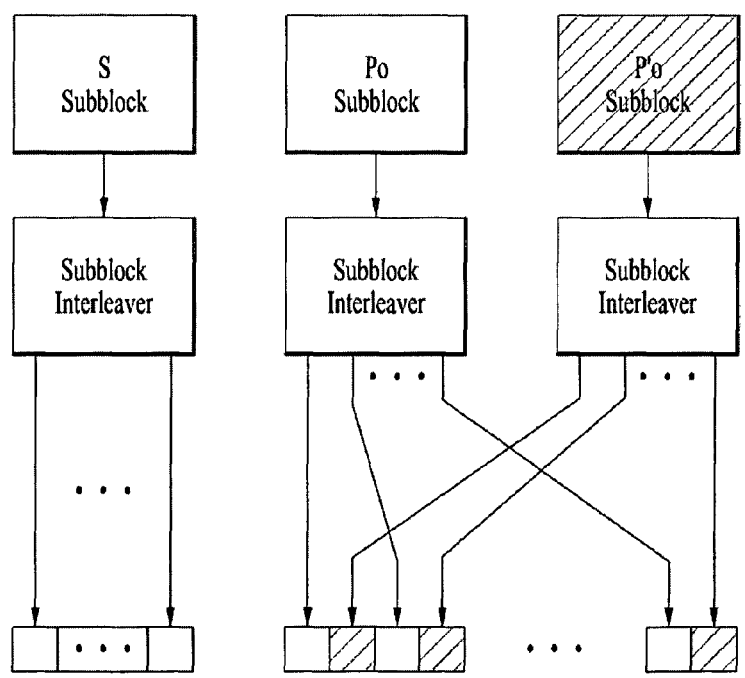
FIG. 8 illustrates an example of a structure of sub-block interleaver.

FIG. 8 illustrates an example of a structure of sub-block interleaver.

Referring to FIG. 8, S subblock contains systematic bits $x_k$. $P_0$ and $P_0'$ subblocks contain parity bits $z_k$ and $z_k'$, respectively. In this case, the subblock S is input to subblock interleaver separately from the subblocks $P_0$ and $P_0'$. After then, interleaved bits are scrambled and transmitted to the receiver.

3.2 Data Signal Transmission Based on Channel Coding

Figure 9:
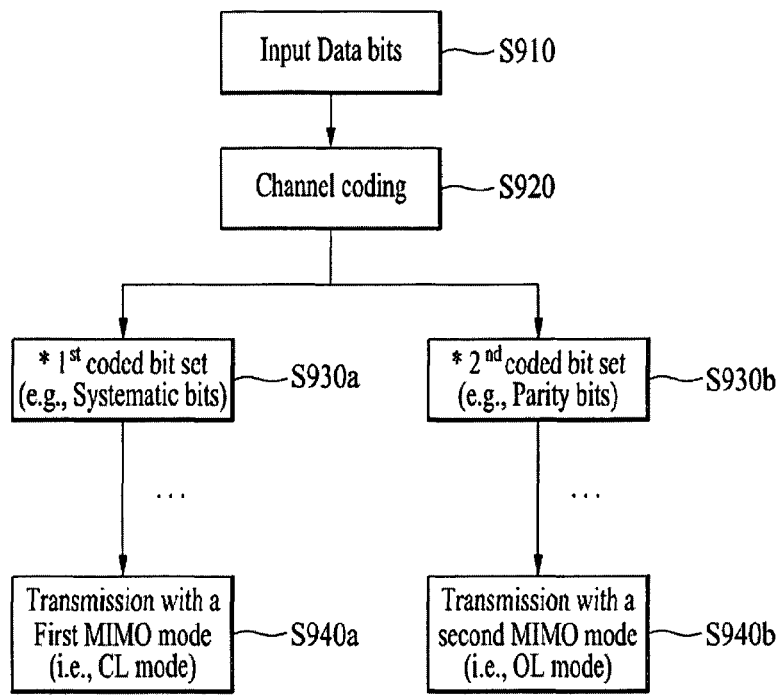
FIG. 9 illustrates one of methods for transmitting data signals of the present invention.

FIG. 9 illustrates one of methods for transmitting data signals of the present invention.

Hereinafter, it is proposed that method to apply different MIMO schemes for the sets of coded bits. As an exemplary embodiment, the first set of coded bits uses the first MIMO mode (e.g., closed-loop MIMO) and the second set(s) of coded bits uses the second MIMO (e.g., open-loop MIMO). In this case, the first set can be a set of systematic bits and the second set(s) can be a set(s) of parity bits from Turbo encoder.

Referring to FIG. 9, the data bits are inputted to the channel encoder at a transmitter (S910).

At the step of S910, the channel encoder may be the turbo encoder explained in FIG. 7. However, the channel encoder is not limited to the turbo encoder and can be replaced to other encoders.

At the channel encoder, the input data bits are encoded (S920) and outputted as the first coded bit set (i.e., 1$^{st}$ coded bit set) and the second coded bit set (i.e., 2$^{nd}$ coded bit set). In this case, the first coded bit set may contain the systematic bits and the second coded bit set may contain the parity bits (S930a, S930b).

The transmitter transmits the first coded bit set by applying a first MIMO mode and the second coded bit set by applying a second MIMO mode. The first MIMO mode may be a closed loop mode and the second MIMO mode may be an open loop mode (S940a, S940b).

When the first and the second coded bit sets are transmitted, the transmitter converts the first and the second coded bit sets to one or more data signals. For example, the first coded bit set is converted to one or more first data signals and the second coded bit sets are converted to one or more second data signals.

For transmitting the coded bit sets, the method and apparatus disclosed in FIG. 3 can be used. That is, all of the processes for transmitting the coded bit sets can be referred to FIG. 3 incorporating the method disclosed in FIG. 9. In this case, the transmitter of FIG. 9 has massive antennas for supporting the massive MIMO. In addition, the first MIMO mode and the second MIMO mode can be changed according to the moving direction of the receiver.

Figure 10:
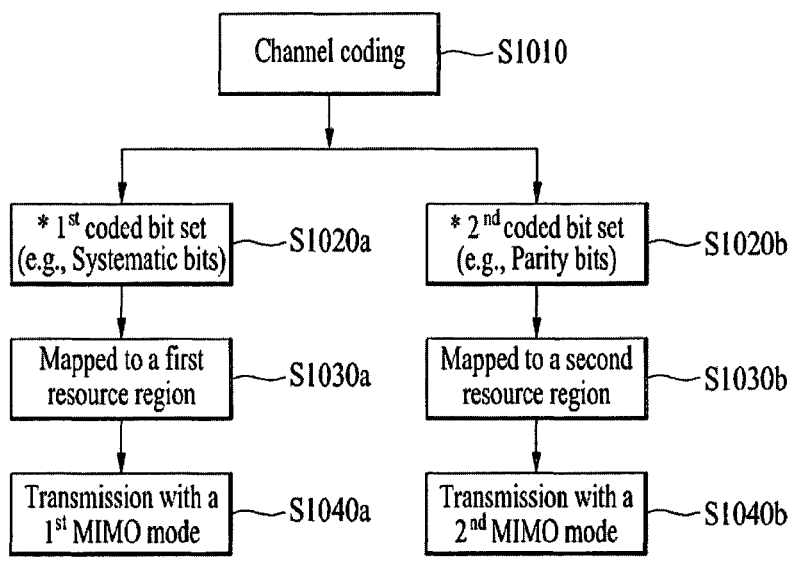
FIG. 10 illustrates another method for transmitting data signals of the present invention.

FIG. 10 illustrates another method for transmitting data signals of the present invention.

Hereinafter, it is proposed that method to apply different frequency and time resources for the sets of coded bits. For example, the first set and the second set(s) of coded bits may be transmitted using different frequency and time resources. In addition, the first MIMO mode may be applied to the first frequency and time resources allocated for the first coded bit set and the second MIMO mode may be applied to the second frequency and time resources allocated for the second set(s) set of coded bits.

Referring to FIG. 10, the data bits are inputted to the channel encoder at a transmitter. The channel encoder may be the turbo encoder explained in FIG. 7. However, the channel encoder is not limited to the turbo encoder and can be replaced to other encoders.

At the channel encoder, the input data bits are encoded and outputted as the first coded bit set (i.e., 1$^{st}$ coded bit set) and the second coded bit set (i.e., 2$^{nd}$ coded bit set). In this case, the first coded bit set may contain the systematic bits and the second coded bit set may contain the parity bits (S1020a, S1020b).

The transmitter maps and allocates the first coded bit set to the first frequency and time resources and the second coded bit set to the second frequency and time resource (S1030a, S1030b).

The transmitter transmits the first coded bit set by using a first MIMO mode and the second coded bit set by using a second MIMO mode. The first MIMO mode may be a closed loop mode and the second MIMO mode may be an open loop mode (S1040a, S1040b).

In FIG. 10, the transmitter is able to transmit the first and the second coded bits using the same antenna elements of the massive MIMO. Besides, for transmitting the coded bit sets, the method and apparatus disclosed in FIG. 3 can be used. That is, all of the processes for transmitting the coded bit sets can be referred to FIG. 3 incorporating the method disclosed in FIG. 10. In this case, the transmitter of FIG. 10 has massive antennas for supporting the massive MIMO. In addition, the first MIMO mode and the second MIMO mode can be changed according to the moving direction of the receiver.

When the first and the second coded bit sets are transmitted, the transmitter converts the first and the second coded bit sets to one or more data signals. For example, the first coded bit set is converted to one or more first data signals and the second coded bit sets are converted to one or more second data signals.

In the conventional channel encoding method, the first coded bit set and the second coded bit set are interleaved and scrambled together. Therefore, the resources for the first coded bit set and the second coded bit set are not distinguished. On the contrary, according to the present application, by allocating more reliable resources to the first coded bit set than the second coded bit sets, the transmission reliability can be increased when the first coded bit set contains the systematic bits. In addition, by transmitting the coded bit sets using different OFDM resources, frequency diversity gain can be obtained.

FIG. 11 illustrates still the other method for transmitting data signals of the present invention.

Hereinafter, it is proposed that method to apply different antenna sets for the coded bit sets. For example, the first set and the second set(s) of coded bits may be transmitted through different set of antennas.

Referring to FIG. 11, the data bits are inputted to the channel encoder at a transmitter. The channel encoder may be the turbo encoder explained in FIG. 7. However, the channel encoder is not limited to the turbo encoder and can be replaced to other encoders.

At the channel encoder, the input data bits are encoded (S1110) and outputted as the first coded bit set (i.e., 1$^{st}$ coded bit set) and the second coded bit set (i.e., 2$^{nd}$ coded bit set)

(S1120a, S1120b). In this case, the first coded bit set may contain the systematic bits and the second coded bit set may contain the parity bits.

The first coded bit set can be transmitted through a first antenna set which includes one or more antenna elements and the second coded bit set(s) can be transmitted through a second antenna set which includes one or more antenna elements. The first and the second antenna sets may contain one or more the same antenna elements but contains at least one different antennal element. At that time, the first antenna set transmits the first coded bit set by using a first MIMO mode and the second antenna set transmits the second coded bit set(s) by using a second MIMO mode. The first MIMO mode may be a closed loop mode and the second MIMO mode may be an open loop mode (S1130a, S1130b).

If the different antenna sets transmit the first coded bit set(s) and the second coded bit set(s), the same resource region can be allocated to the different coded bit sets. Accordingly, the radio resources can be saved. In addition, the transmitter can achieve a beamforming gain and antenna diversity by transmitting with the close loop mode and the open loop mode.

When the first and the second coded bit sets are transmitted, the transmitter converts the first and the second coded bit sets to one or more data signals. For example, the first coded bit set is converted to one or more first data signals and the second coded bit sets are converted to one or more second data signals.

FIG. 12 illustrates still the other method for transmitting data signals of the present invention.

Hereinafter, it is proposed that method to apply different Eigen modes for the sets of coded bits. In this case, the same MIMO mode (e.g., closed-loop mode) may be applied to the first set of coded bits and the second set(s) of coded bits. When there are more than one eigen-modes (e.g., rank>=2), the first coded bit set can be transmitted using an eigen-mode with greater gain, and the second coded bit set(s) can be transmitted using eigen-mode(s) with less gain(s).

Referring to FIG. 12, the data bits are inputted to the channel encoder at a transmitter (S1210).

At the step of S1210, the channel encoder may be the turbo encoder explained in FIG. 7. However, the channel encoder is not limited to the turbo encoder and can be replaced to other encoders.

At the channel encoder, the input data bits are encoded (S1220) and outputted as the first coded bit set (i.e., $1^{st}$ coded bit set) and the second coded bit set (i.e., 2" coded bit set). In this case, the first coded bit set may contain the systematic bits and the second coded bit set may contain the parity bits (S1230a, S1230b).

The transmitter transmits the first coded bit set by using a higher Eigen mode and the second coded bit set by using a lower Eigen mode. In this case, the MIMO mode applied to the first and the second coded bit sets are the same as the closed loop or the open loop (S1240a, S1240b).

When the first and the second coded bit sets are transmitted, the transmitter converts the first and the second coded bit sets to one or more data signals. For example, the first coded bit set is converted to one or more first data signals and the second coded bit sets are converted to one or more second data signals.

For transmitting the coded bit sets, the method and apparatus disclosed in FIG. 3 can be used. That is, all of the processes for transmitting the coded bit sets can be referred to FIG. 3 incorporating the method disclosed in FIG. 12. In this case, the transmitter of FIG. 12 has massive antennas for supporting the massive MIMO. In addition, the first MIMO mode and the second MIMO mode can be changed according to the moving direction of the receiver.

3.3 Retransmission Method of the Massive MIMO

When retransmission(s) is needed (e.g., due to erroneous reception at the receiver), MIMO modes may be differently applied to the first and the second coded bits at the retransmission. For example, when the retransmission is requested, the data input bits can be processed by using method explained in FIGS. 9 to 12.

In this case, the MIMO modes which have been applied to the initial transmission are changed to each other for the first coded bit set and the second coded bit set. For example, if the first coded bit set was transmitted at the initial transmission with the first MIMO mode (closed loop mode), the second MIMO mode (open loop mode) is applied to the retransmission of the first coded bit set and vice versa.

3.4 the Number of Coded Bits of the Coded Bit Set

For the methods explained FIGS. 9 to 12, when the numbers of coded bits are different in the first and the second sets of coded bits, the first set of coded bits is at first applied to the Eigen mode with greater gain. The second set(s) of coded bits may be transmitted using the same and/or different Eigen-mode(s) with the first set of coded bits 3.5 Modulation Order for the Massive MIMO For the methods explained FIGS. 9 to 12, the first set of coded bits may be transmitted using less modulation order (e.g., QPSK) and the second set(s) of coded bits may be transmitted using higher order of modulation (e.g., 64 QAM) because it is preferred that the systematic bits are transmitted more robustly than the party bits.

3.6 Direction of Receiver

For the methods explained FIGS. 9 to 12, when the transmitter determines the MIMO mode applied to the first and the second coded bit sets, the transmitter considers the direction of the receiver. For example, if the direction of the receiver is vertical to the transmitter, the antenna elements for horizontal array apply the open loop and antenna elements for vertical array apply the closed loop (refer to FIG. 6(*b*)).

4. Methods for Transmitting Downlink Signal

The embodiments disclosed in section 3 can be applied to downlink. In this case, the transmitter can be a base station (i.e., eNB) and receiver can be a UE. Actually, the coded bits of the first and the second sets are not transmitted as it is. The coded bits are processed by the elements explained in FIG. 3. Therefore, the final forms of the coded bits are OFDM symbols or OFDM signals. However, for convenience of the explanation of the present inventions, the coded bits were equivalently used with the OFDM symbols or the OFDM signals.

Figure 13:
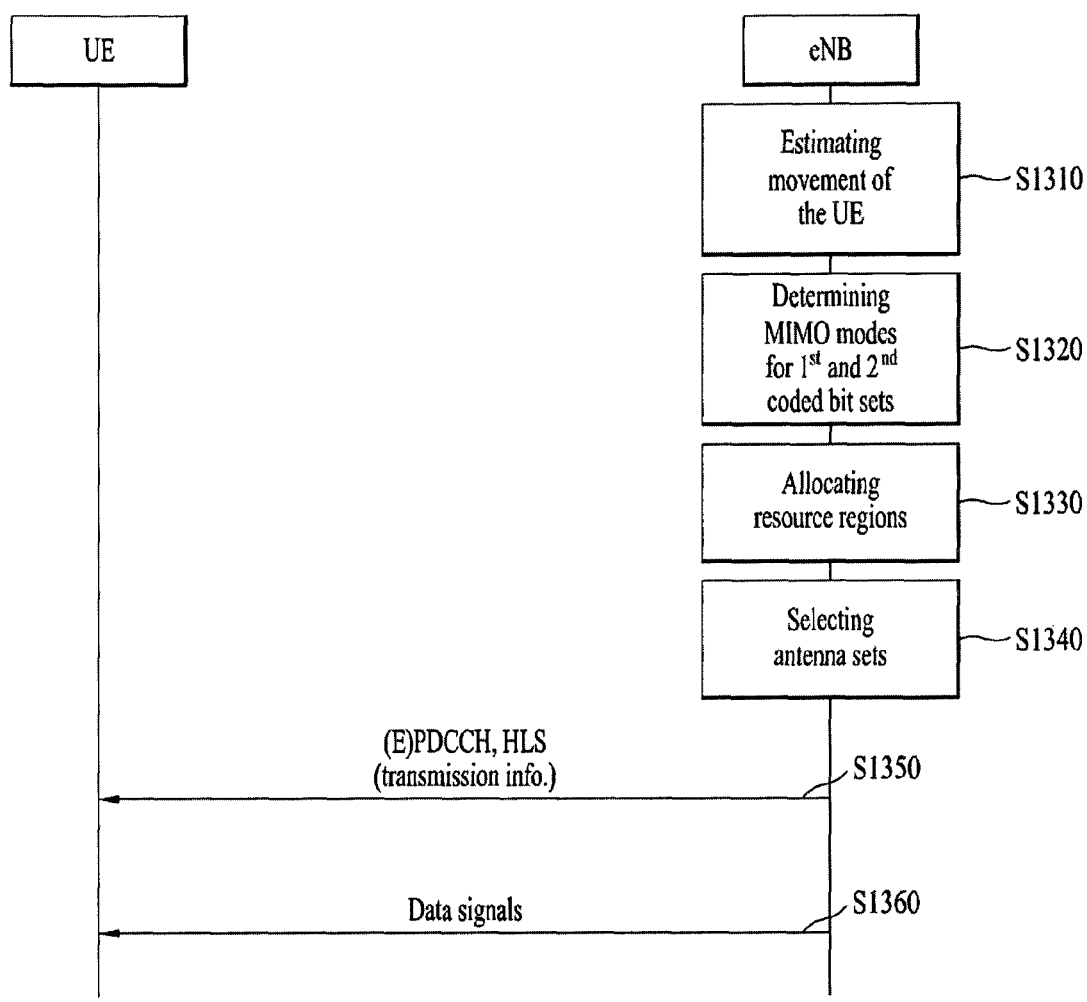
FIG. 13 illustrates procedure for transmitting downlink (DL) signal.

FIG. 13 illustrates procedure for transmitting downlink (DL) signal.

The eNB estimates the movement of the UE, i.e., the direction of the UE based on feedback information from the UE and/or an uplink measurement performed by the eNB (S1310).

The eNB performs channel encoding by using the method disclosed in sections 2 to 3. After then, the eNB determines MIMO modes for the first and the second coded bit sets in consideration of the direction of the UE (S1320).

The eNB may allocate resource regions for the first and the second coded bit sets. In this case, the resource regions may be the same for the first and the second coded bit or different for the first and the second coded bit (refer to FIG. 10) (S1330).

The eNB may select antenna sets for the systematic bits and the parity bits. In this case, the antenna sets for the first and the second coded bits may be selected with the same antenna elements or with the different antenna elements (refer to FIG. 11) (S1340).

The steps of S1330 and S1340 are optional, so these steps may be alternatively performed by the eNB.

The eNB transmits transmission information for the first and the second coded bit sets by using a control signal on a (E)PDCCH or a high layer signal (HLS) (S1350).

The transmission information includes at least one of MIMO mode information indicating the MIMO modes, Resource allocation information indicating allocated resource region, or Antenna set information indicating assigned antenna set for the first and the second coded bit sets, respectively.

Finally, the eNB is able to transmit the data signals transformed from the first coded bit set and the second coded bit sets according to the transmission information (S1360).

5. Apparatuses for Implementing the Aforementioned Methods

Figure 14:
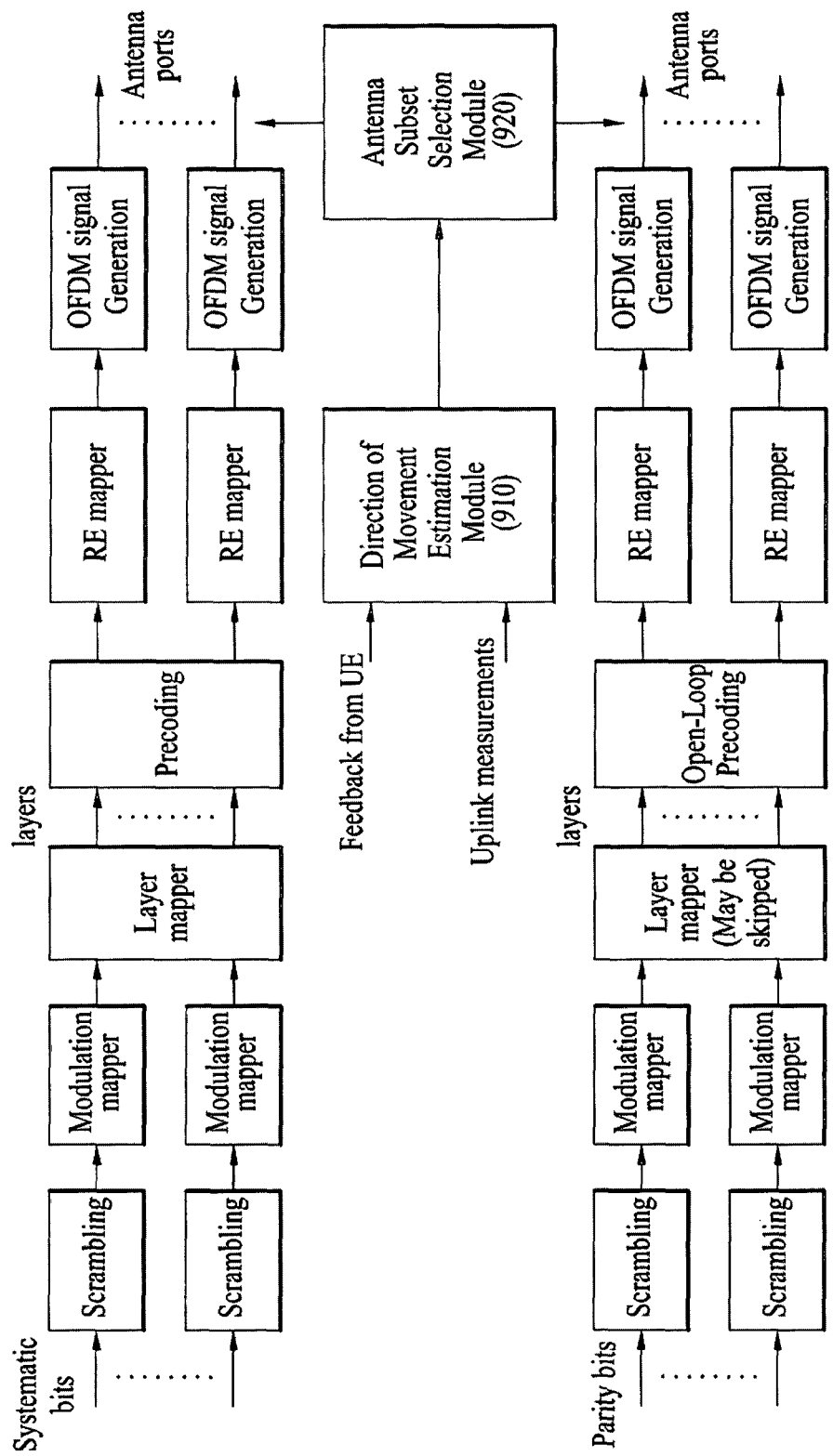
FIG. 14 illustrates another configuration of a base station (BS) and a signal processing procedure for transmitting a downlink signal.

FIG. 14 illustrates another configuration of a base station (BS) and a signal processing procedure for transmitting a downlink signal.

The base station illustrated on FIG. 14 uses the configuration of the BS on FIG. 3. However, the base station separately processes the systematic bits and the parity bits. The explanation of the configurations on FIG. 14 which are the same with FIG. 3 is omitted and it can be referred to FIG. 3 and description thereof.

Referring to FIG. 14, the Direction of Movement Estimation Module (910) of the BS receives feedback information from the UE and measure the uplink status. The Direction of Movement Estimation Module estimates the direction of the UE based on the feedback information and the uplink measurement.

The direction information of the UE is transferred to the Antenna Subset Selection Module (920). The Antenna Subset Selection Module selects antenna element sets for the systematic bits and the parity bits, respectively.

So, if the UE moves along horizon direction, then closed MIMO mode is applied to V-beams which are emitted from the vertical array antenna element and open MIMO mode is applied to H-beams which are emitted from the horizontal array antenna element.

Figure 15:
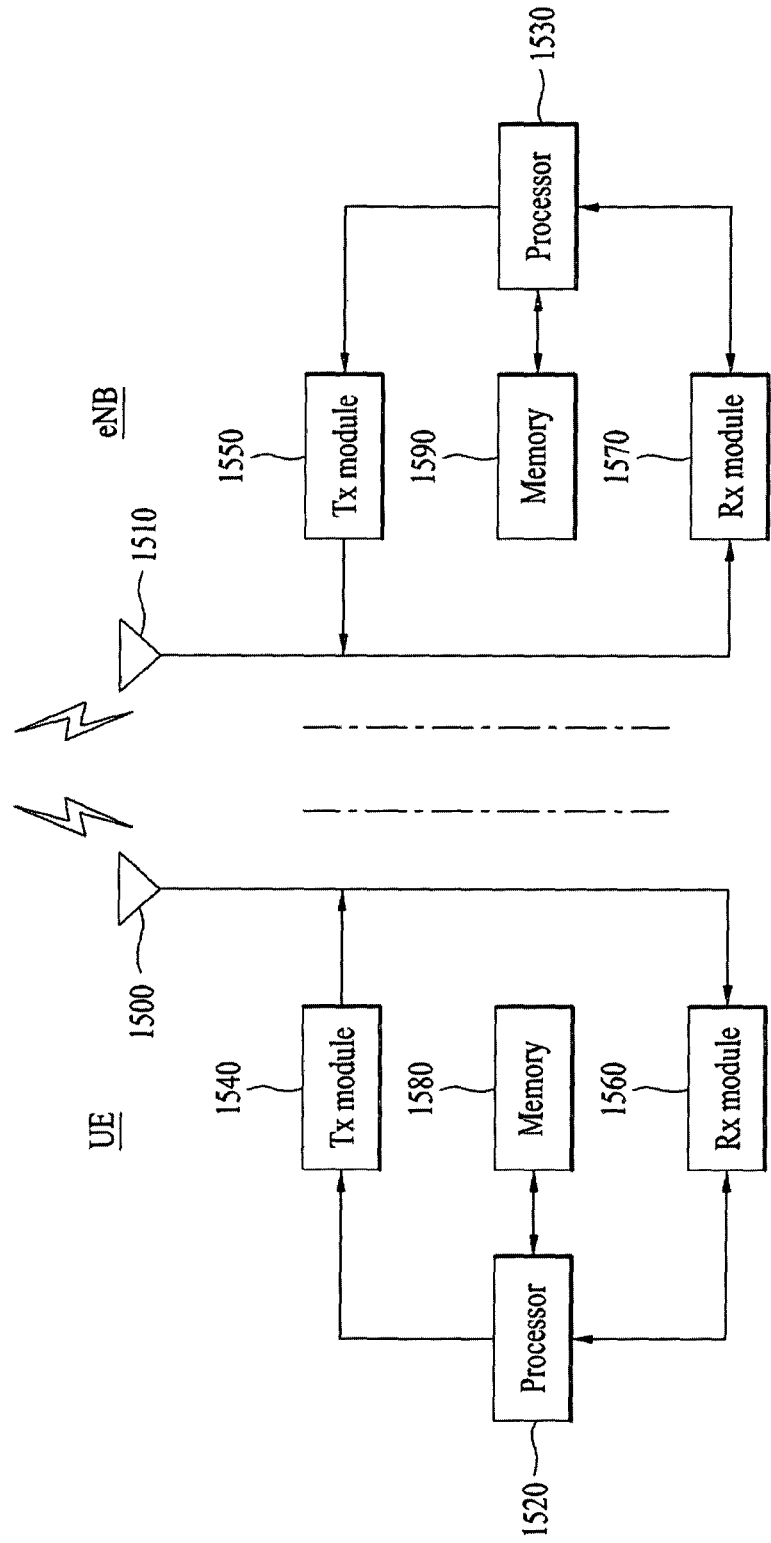
FIG. 15 shows apparatuses for implementing the above-mentioned methods described with reference to FIGS. 1 to 14.

FIG. 15 shows apparatuses for implementing the above-mentioned methods described with reference to FIGS. 1 to 14.

A UE can serve as a transmitter on uplink and as a receiver on downlink. An eNB can serve as a receiver on uplink and as a transmitter on downlink.

The UE and the eNB may include transmission modules (Tx modules) 1540 and 1550 and reception modules (Rx modules) 1560 and 1570 for controlling transmission and reception of data and/or messages and antennas 1500 and 1510 for transmitting and receiving information, data and/or messages, respectively.

In addition, the UE and the eNB may respectively include processors 1520 and 1530 for performing the above-described embodiments of the present invention and memories 1570 and 1590 for storing processing procedures of the processors temporarily or continuously.

The embodiments of the present invention can be performed using the aforementioned components and functions of the UE and the eNB. The apparatuses shown in FIG. 15 may further include the components shown in FIGS. 2, 3 and 14. The processors 1520 and 1530 preferably include the components shown in FIGS. 2, 3 and 14. For example, the Direction of Movement Estimation Module (910) and the Antenna Subset Selection Module (920) can be included in the processor 1530.

The UE and the eNB disclosed on FIG. 15 are able to perform the method described on FIGS. 5 to 14. For example, the processors 1520, 1530 may perform the methods disclosed on FIGS. 9 to 12 and the Tx module 1540, 1550 and Rx module 1560, 1570 are used to transmit or receive the signals and/or the data symbol.

The transmission modules 1540 and 1550 and the reception modules 1560 and 1570 included in the UE and the eNB can have packet modulation and demodulation functions, a fast packet channel coding function, an OFDMA packet scheduling function, a TDD packet scheduling function and/or a channel multiplexing function. In addition, the UE and the eNB may further include a low-power radio frequency (RF)/intermediate frequency (IF) module.

In the embodiments of the present invention can use a personal digital assistant (PDA), a cellular phone, a personal communication service (PCS) phone, a global system for mobile (GSM) phone, a wideband CDMA (WCDMA) phone, a mobile broadband system (MBS) phone, a hand-held PC, a notebook PC, a smart phone, a multi-mode multi-band (MM-MB) terminal or the like as the UE.

Here, the smart phone is a terminal having advantages of both a mobile communication terminal and a PDA. The smart phone can be a mobile communication terminal having scheduling and data communication functions including facsimile transmission/reception, Internet access, etc. of the PDA. The MM-MB terminal means a terminal including a multi-modem chip, which can be operated in both a portable Internet system and a mobile communication system (e.g., CDMA 2000 system, WCDMA system, etc.).

The exemplary embodiments of the present invention may be achieved by various means, for example, hardware, firmware, software, or a combination thereof.

In a hardware configuration, the exemplary embodiments of the present invention may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the exemplary embodiments of the present invention may be achieved by a module, a procedure, a function, etc. performing the above-described functions or operations. Software code may be stored in a memory unit and executed by a processor. The memory unit may be located at the interior or exterior of the processor and may transmit and receive data to and from the processor via various known means.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The embodiments of the present invention may be applied to various wireless access systems. The wireless access systems include 3GPP, 3GPP2 and/or IEEE 802.xx (Institute of Electrical and Electronic Engineers 802) system, etc. The embodiments of the present invention may be applied to technical fields using the various wireless access systems in addition to the wireless access systems.

What is claimed is:

1. A method for transmitting data signals by using a massive Multi Input Multi Output (MIMO) in a wireless access system, the method performed by a transmitter and comprising:

inputting bits of the data signals to a channel encoder;

outputting from the channel encoder a first coded bit set including one or more coded bits and second coded bit set including one or more coded bits; and when a moving direction of a receiver is vertical to the transmitter, transmitting the first coded bit set through a horizontal antenna elements array according to a closed loop MIMO mode and transmitting the second coded bit set through vertical antenna elements array according to an open loop MIMO mode, or when a moving direction of the receiver is horizontal to the transmitter, transmitting the first coded bit set through the vertical antenna elements array according to the closed loop MIMO mode and transmitting the second coded bit set through the horizontal antenna elements array according to the open loop MIMO mode.

2. The method according to claim 1, wherein the first coded bit set contains systematic bits and the second coded bit set contains parity bits.

3. The method according to claim 1, wherein the first coded bit set is transmitted on a first resource region and the second coded bit set is transmitted on a second resource region.

4. The method according to claim 1, wherein the first coded bit set and the second coded bit set are transmitted on a same resource region.

5. A transmitter for transmitting data signals by using a massive Multi Input Multi Output (MIMO) in a wireless access system, the transmitter comprising:

a channel encoder;
a transmitting unit; and
a processor configured to support a transmission of the data signals, wherein the processor is configured to input bits of the data signals to the channel encoder, wherein the channel encoder is configured to output a first coded bit set including one or more coded bits and a second coded bit set including one or more coded bits, and wherein:

when a moving direction of a receiver is vertical to the transmitter, the processor controls the transmitting unit to transmit the first coded bit set through horizontal antenna elements array according to a closed loop MIMO mode and transmit the second coded bit set through a vertical antenna elements array according to an open loop MIMO mode, or when a moving direction of the receiver is horizontal to the transmitter, the processor controls the transmitting unit to transmit the first coded bit set through the vertical antenna elements array according to the closed loop MIMO mode and the second coded bit set through the horizontal antenna elements array according to the open loop MIMO mode.

6. The transmitter according to claim 5, wherein the first coded bit set contains systematic bits and the second coded bit set contains parity bits.

7. The transmitter according to claim 5, wherein the first coded bit set is transmitted on a first resource region and the second coded bit set is transmitted on a second resource region.

8. The transmitter according to claim 5, wherein the first coded bit set and the second coded bit set are transmitted on a same resource region.

* * * * *